United States Patent
Poddar et al.

(10) Patent No.: US 8,389,334 B2
(45) Date of Patent: Mar. 5, 2013

(54) FOIL-BASED METHOD FOR PACKAGING INTERGRATED CIRCUITS

(75) Inventors: Aninyda Poddar, Sunnyvale, CA (US); Nghia T. Tu, San Jose, CA (US); Hau Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 186 days.

(21) Appl. No.: 12/858,331

(22) Filed: Aug. 17, 2010

(65) Prior Publication Data

US 2012/0043660 A1    Feb. 23, 2012

(51) Int. Cl.
  *H01L 23/31*    (2006.01)
(52) U.S. Cl. ........................................ 438/113
(58) Field of Classification Search .................. 257/773, 257/774–776; 438/113, 121, 613, 637
  See application file for complete search history.

(56) References Cited

U.S. PATENT DOCUMENTS

| 6,664,615 | B1 * | 12/2003 | Bayan et al. | 257/666 |
| 8,101,470 | B2 * | 1/2012 | Poddar et al. | 438/124 |
| 2003/0134453 | A1 * | 7/2003 | Prabhu et al. | 438/113 |
| 2009/0305076 | A1 | 12/2009 | Wong et al. | |
| 2010/0046188 | A1 | 2/2010 | Bayan et al. | |
| 2010/0084748 | A1 | 4/2010 | Poddar et al. | |

OTHER PUBLICATIONS

U.S. Appl. No. 12/571,202, filed Sep. 30, 2009.
U.S. Appl. No. 12/571,223, filed Sep. 30, 2009.
U.S. Appl. No. 12/772,896, filed May 3, 2010.

* cited by examiner

*Primary Examiner* — Nathan Ha

(74) *Attorney, Agent, or Firm* — Eugene C. Conser; Wade J. Brady, III; Frederick J. Telecky, Jr.

(57) ABSTRACT

One aspect of the present invention involves a foil-based method for packaging integrated circuits. Initially, a metallic foil and a photoresist layer are attached with a carrier. The photoresist layer is exposed and patterned. Afterward, multiple integrated circuit dice are connected to the foil. The dice and portions of the foil are encapsulated in a molding material. The foil is then etched based on the patterned photoresist layer to define multiple device areas in the foil, where each device area supports at least one of the integrated circuit dice. Some aspects of the present invention relate to panel arrangements that are involved in the aforementioned method.

10 Claims, 10 Drawing Sheets

FOIL-BASED METHOD FOR PACKAGING INTERGRATED CIRCUITS

FIELD OF THE INVENTION

The present invention relates generally to the packaging of integrated circuits. More particularly, the invention relates to packaging methods and arrangements involving thin foils.

BACKGROUND OF THE INVENTION

There are a number of conventional processes for packaging integrated circuit (IC) devices. By way of example, many plastic IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connections to external devices, such as a printed circuit board (PCB).

At various times, package designs have been proposed that utilize a metallic foil as the electrical interconnect structure in place of the leadframe. The metallic foil is typically significantly thinner than the metal sheets or panels used to form conventional leadframes. Consequently, foil-based IC packaging methods have the potential of reducing package thickness due in part to the reduced thickness of the metallic interconnect structure.

Some of the present inventors have previously described foil-based methods of packaging integrated circuits. By way of example, U.S. patent application Ser. No. 12/133,335, entitled "Foil Based Semiconductor Package," filed Jun. 4, 2008; U.S. patent application Ser. No. 12/195,704, entitled "Thin Foil Semiconductor Package," filed Aug. 21, 2008; U.S. patent application Ser. No. 12/571,202, entitled "Foil Based Semiconductor Package", filed Sep. 30, 2009; U.S. patent application Ser. No. 12/571,223, entitled "Foil Plating For Semiconductor Packaging," filed Sep. 30, 2009; and U.S. patent application Ser. No. 12/772,896, entitled "Laser Ablation Alternative to Low Cost Leadframe Process," filed May 3, 2010, which each describe improved foil based methods of packaging integrated circuits. Each of these prior applications is hereby incorporated by reference herein for all purposes. In some of the described processes, a foil is bonded to a substantially rigid carrier during a portion of the fabrication process in order to prevent the foil from warping. Various methods may be used to pattern the foil in a manner suitable for use in integrated circuit packages. The patterned foils are then used in the packaging process.

Although a number of foil based packaging techniques exist, there are continuing efforts to develop even more efficient designs and methods for packaging integrated circuits.

SUMMARY OF THE INVENTION

In one aspect of the present invention, a foil-based method for packaging integrated circuit will be described. Initially, a metallic foil and a photoresist layer are attached with a carrier. The photoresist layer is exposed and patterned. Various alignment features may be formed in the foil. Afterward, multiple integrated circuit dice are connected to the foil. The dice and portions of the foil are encapsulated in a molding material. The foil is then etched based on the patterned photoresist layer to define multiple device areas in the foil. Each device area supports at least one of the integrated circuit dice.

In various implementations, the patterning of the photoresist layer and the formation of alignment features in the foil before the die attach operation allow the dice to be electrically and physically connected to the foil with greater precision. Various approaches involve wirebonding the dice directly to the foil without using an intermediate adhesion layer (e.g., without pre-plating the foil with silver). As a result, the expense involved in plating and etching a silver layer on the foil may be avoided.

The present invention contemplates a number of variations on the aforementioned method. In one embodiment, the metallic foil, photoresist layer and carrier are arranged such that the photoresist layer is sandwiched between the carrier and the metallic foil. The carrier includes multiple openings through which various photolithographic and etching processes can take place.

In another embodiment, the metallic foil, photoresist layer and carrier are arranged such that the metallic foil is sandwiched between the carrier and the photoresist layer. In this embodiment, the dice are positioned within openings in the carrier, and the encapsulation process involves at least partially filling the openings with molding material to form multiple molded frames. Each molded frame may contain multiple integrated circuit dice and device areas.

Various other aspects of the invention relate to arrangements that are formed using the above methods.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits (IC). More specifically, the present invention relates to using a thin foil to form electrical interconnects in an IC package. As mentioned in the background section, some of the inventors have previously proposed foil based methods for packaging integrated circuits. Various aspects of the present invention improve upon these earlier methods.

Figure 1:
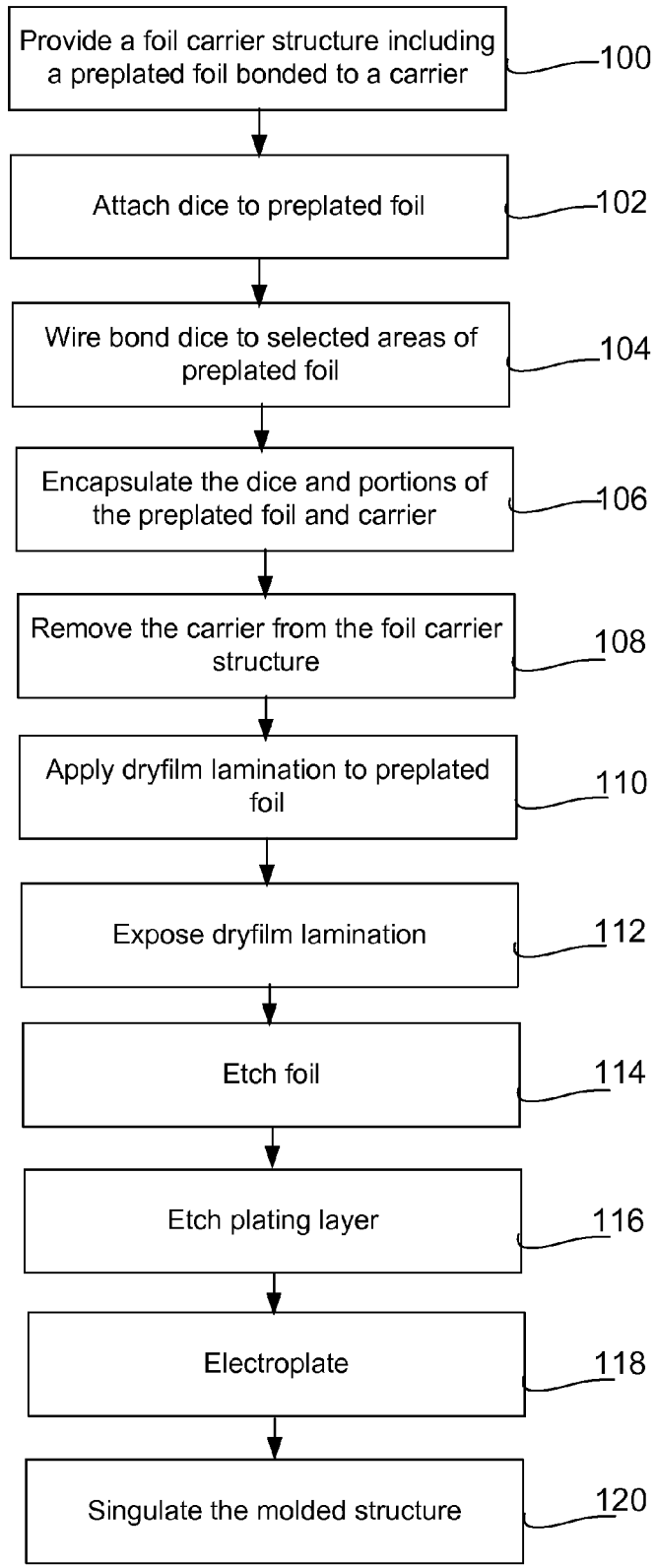
FIG. 1 is a flow chart illustrating a foil based process for packaging integrated circuits.

By way of background, FIG. 1 illustrates one of the previously described techniques. Initially, a foil carrier structure is provided (step 100). The foil carrier structure includes a thin sheet of copper foil that has been secured to an aluminum carrier. The carrier provides structural support to the foil during various processing steps. Eventually, the electrical contacts for the package will be formed from the foil. The exposed surface of the copper foil is preplated with a thin silver plating layer to facilitate subsequent wire bonding.

In step 102, a plurality of dice are attached to the preplated foil using conventional die attach techniques. The dice are then wire bonded to selected areas of the preplated foil in step 104 using conventional (typically gold) bonding wires. Portions of the foil carrier structure, dice, and bonding wires are then encapsulated with a plastic molding material in step 106 to form a molded foil carrier structure (step 106). After encapsulation, the carrier is removed from the foil carrier structure (step 108) to form a molded foil structure. The carrier is no longer necessary after encapsulation, because the plastic molding material provides sufficient structural support to facilitate handling during the remainder of the packaging process.

After the carrier has been removed, the foil is patterned using conventional photolithographic and etching techniques to form any desired metal structures, including the electrical contacts and optionally a die attach pad. As will be appreciated by those familiar with the art, photo imaging based patterning techniques require several steps. Initially a photoresist layer is applied to the exposed surface of the foil by any suitable technique such as dryfilm lamination (step 110). The photoresist is then photolithographically exposed to pattern the resist and unwanted portions of the resist are removed using conventional photoimaging techniques (step 112). The resulting structure leaves portions of the foil that are to be removed exposed, while portions of the foil to be retained are covered by the resist. After the resist has been patterned, exposed portions of the metallic foil are removed using a copper etch (step 114) to pattern the foil. Typically, different etchants are used to etch the copper foil and the silver plating. Therefore, a separate silver etching process (step 116) is used to remove the underlying portions of the silver plating layer after the copper foil etch has been completed. After the silver etch has been completed, the remaining resist is stripped away to expose the retained portions of the foil and the patterning of the foil is completed. The resulting structures define the contacts associated with each package, as well as any die attach pads and bus bars that might be appropriate for a given panel.

After the foil patterning has been completed, solder is optionally electroplated onto the exposed electrical contacts in step 118, and the molded foil structure is singulated along predefined saw streets in step 120 to form individual integrated circuit packages. The described process can be used to successfully pattern thin metallic foils and to use the resulting patterned foil as electrical interconnects in integrated circuit packages.

Although the method described above works well for various applications, there are areas in which it could be improved. For one, plating the copper foil with silver is expensive. Additionally, it has been determined that silver etching may sometimes damage the package. More specifically, if the etching is too shallow, a thin layer of silver may be left behind, which can cause a short circuit between adjacent electrical contacts on the package. If the etching runs too deep, however, it can weaken the bond between the molding material and the electrical contact pads. As a result, when stress is applied to the package during later stages of the packaging process (e.g., during a sawing operation), the electrical contact pads may peel away from the package.

The present invention contemplates improvements to the method illustrated in FIG. 1 to address these and/or other issues. In some embodiments, for example, there is no silver plating or silver etching steps. Instead, the bonding wires are connected directly to the metallic foil without an intermediate adhesion layer. In still other embodiments, some of the steps of the method are modified and reordered. By way of example, a photoresist layer may be positioned over the foil and patterned prior to the attachment of the dice to the foil. Alignment features based on the patterned photoresist layer may be formed in the foil prior to the die attach operation and encapsulation. This approach helps improve the precision with which the dice are connected to the foil.

Figure 2:
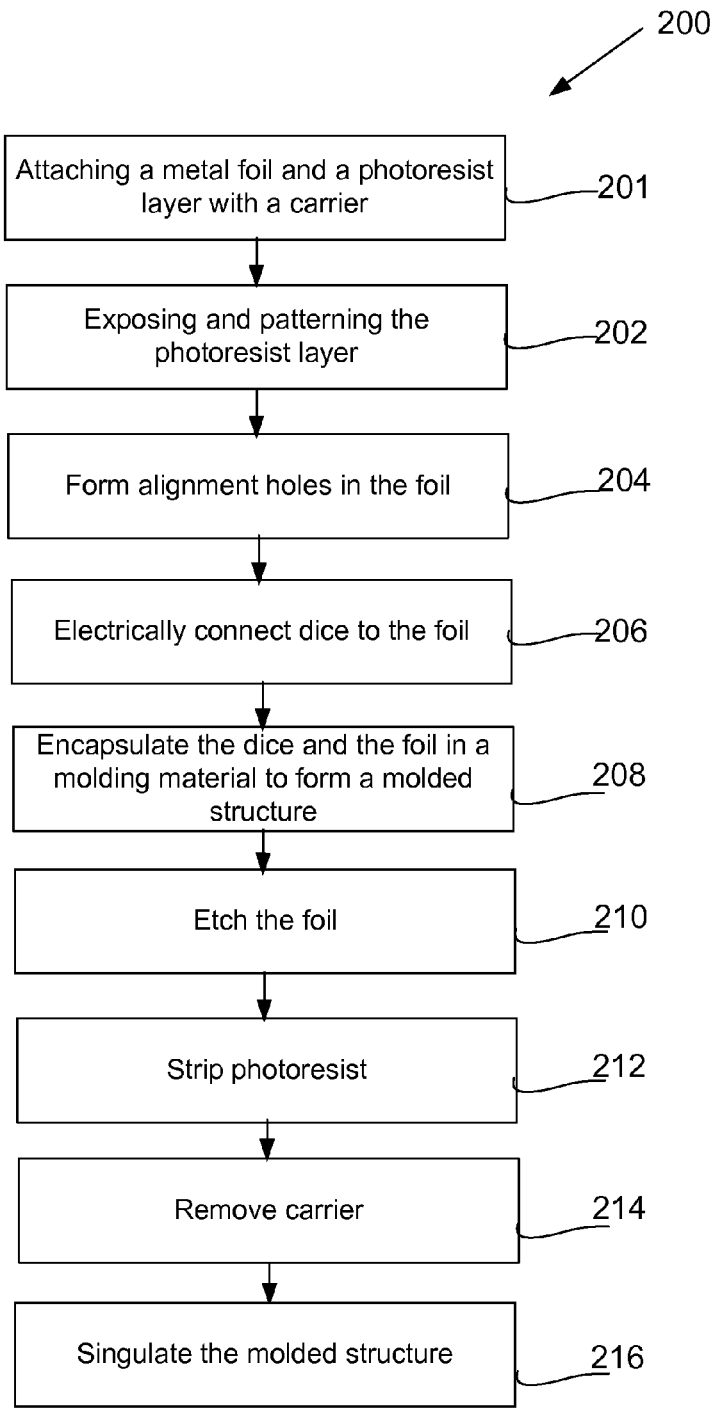
FIG. 2 is a flow chart illustrating a foil based process for packaging integrated circuits in accordance with one embodiment of the present invention.
Figure 3A:
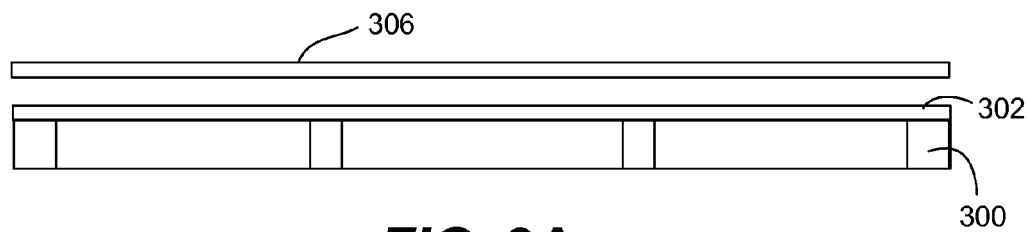
FIGS. 3A-3M are diagrammatic side and top views of various stages of the packaging process illustrated in FIG. 2.

Referring now to FIG. 2 in combination with FIGS. 3A-3M, an improved foil-based method 200 for packaging integrated circuits will be described. In step 201 of FIG. 2 and FIGS. 3A and 3C, a metallic foil 306 and a photoresist layer 302 are attached with a carrier 300. In the described embodiment, the photoresist layer 302 is sandwiched between the carrier 300 and the metallic foil 306. The photoresist layer 302, the carrier 300 and the metallic foil 306 may be attached together using any suitable technique known in the art. For example, the photoresist layer 302, the carrier 300 and the metallic foil 306 may be laminated together in a single lamination process, such that the photoresist layer 302 acts as an intermediate adhesion layer that bonds the carrier 300 and the metallic foil 306 with one another.

The thickness and composition of the metallic foil 306 may vary, depending on the needs of a particular application. Any material, such as copper, that is suitable for use as an electrical interconnect may be used to form the metallic foil 306. In various embodiments, the thickness of the foil is approximately between 5 and 80 microns, although thinner and thicker foils are also contemplated for various applications.

The carrier 300 may be formed from any suitable material that has enough structural rigidity to physically support the thin foil through various stages of the packaging process. Preferably, the carrier 300 is made of inexpensive and/or recyclable materials that are commonly used in the manufacturing of printed circuit boards (PCBs). Mild steel, carbon steel, stainless steel, aluminum, copper, FR2 and FR4 work well as materials for the carrier 300.

A wide variety of carrier sizes are contemplated in the present invention. In a preferred embodiment, the carrier is sized appropriately so that it may be handled by conventional packaging equipment and/or existing equipment that is used to process PCBs. Some implementations involve a carrier 300 that has a surface area between approximately 250 and 450 square inches and/or a thickness between approximately 50 µm and 300 µm. For example, a carrier that is approximately 18 inches×22 inches work well for some applications, although of course larger and smaller dimensions are possible.

Figure 3B:
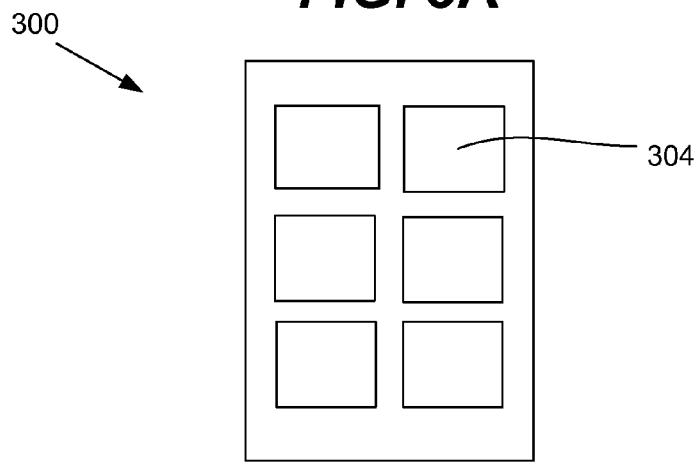

Referring now to FIG. 3B, which is a diagrammatic top view of the carrier 300, there are openings 304 in the carrier 300 which allow access to the underlying photoresist layer 302. The openings 304 penetrate entirely through the carrier 300 and can be arranged in various configurations, such as a 2-dimensional array. In some embodiments, each opening 304 eventually helps define a region that includes multiple device areas. (For the purpose of illustration, later figures (e.g., FIG. 3F) indicate an opening 304 whose cross-sectional width is arranged to fit a single die and device area. It should be appreciated that in most implementations, the width of the opening 304 will be able to accommodate many more dice and device areas.)

Figure 3C:
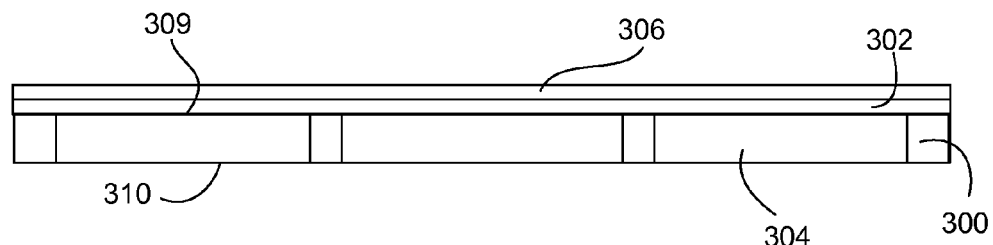

FIG. 3C illustrates the carrier 300 after the photoresist layer 302 and the foil 306 have been attached with it. In the illustrated embodiment, the carrier 300 includes a top side 309 and an opposing bottom side 310, where the top side 309 is covered with the photoresist layer 302 having a substantially uniform thickness. Layered over the photoresist layer 302 and the top side 309 of the carrier 300 is the foil 306. The photoresist layer 302 extends continuously over multiple openings in the carrier 300 and has a substantially uniform thickness. Accordingly, the openings 304 allow access through the bottom side 310 of the carrier 300 to the overlying photoresist layer 302. These openings 304 can be used to perform various photolithographic operations on the photoresist layer 302, as will be described in greater detail below.

Figure 3D:
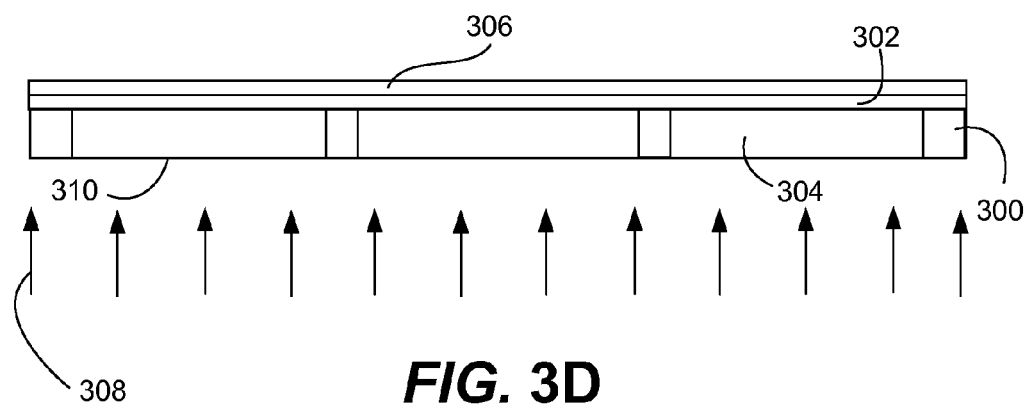
Figure 3E:
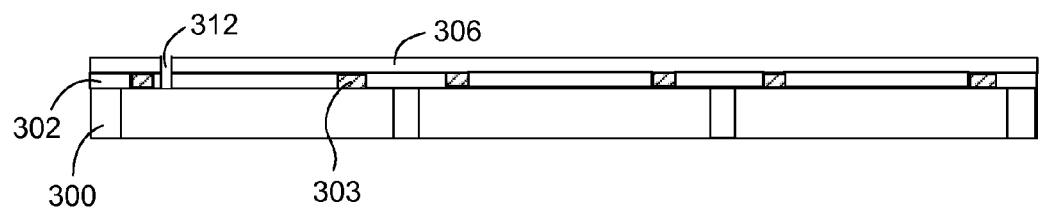

At step 202 of FIG. 2, the photoresist layer 302 is exposed and patterned. The exposure and patterning of the photoresist layer 302 may be performed using any known photolithographic techniques. In FIG. 3D, for example, portions of the photoresist layer 302 are exposed to a light 308. The light 308 is projected towards the bottom side 310 of the carrier 300, where it passes through the carrier 300 via its openings 304 and is absorbed by the photoresist layer 302. FIG. 3E illustrates the photoresist layer 302 after it has been patterned. In the illustrated embodiment, the photoresist layer 302 is a positive photoresist, although in other implementations a negative photoresist may be used. The exposed portions 303 of the photoresist layer 302 have been chemically altered to be soluble in a suitable developer solution. In various embodiments, the photoresist layer 302 is selectively exposed to light during a photolithographic process such that some portions of the photoresist layer 302 are cross-linked while other portions of the photoresist layer 302 are not cross-linked. Preferably, the developer solution is not applied to remove portions of the photoresist layer 302 until after the die attach and encapsulation operations (steps 206 and 208) have been performed, as the developer solution may weaken the structural integrity of the underlying foil 306.

Afterwards, one or more alignment features are formed in the foil (step 204 of FIG. 2) Each alignment feature may be any feature, mark or structure known in the art (e.g., alignment holes, etc.), that is used to help properly align dice on the foil 306. In the illustrated embodiment of FIG. 3E, a single alignment hole 312 has been drilled through the metallic foil 306 and the photoresist layer 302, although of course any suitable number and types of alignment features may be formed in the foil at this stage based on the patterning of the photoresist layer. The integrated circuit dice are then attached to the metallic foil 306 (step 206) using the alignment features. It should be appreciated that in some previously proposed designs, the patterning of a photoresist layer (e.g., step 112 of FIG. 1) takes place after the dice have already been connected to the foil and encapsulated. An advantage of the described approach is that the patterning take place before the dice are placed. Therefore, alignment features based on the patterning can be formed in the foil which can help to improve the alignment of the dice on the foil.

Figure 3F:
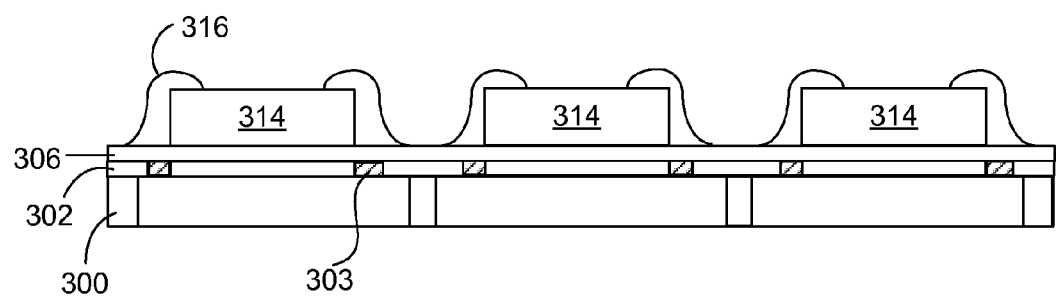

The dice 314 of FIG. 3F may be attached to the foil 306 in any suitable manner. Preferably, the dice 314 are wirebonded directly to the foil 306. That is, there is no intermediate adhesion layer (e.g., silver plating) that helps to secure the bonding wires 316 of FIG. 3F to the foil 306. The bonding wires 316 may be formed of a variety of materials, depending on the needs of a particular application. By way of example, gold or aluminum work well for particular implementations. Without an intermediate adhesion layer to help connect the bonding wire 316 to the foil 306, various additional techniques may be used to strengthen the connection. By way of example, the wirebonding of the dice 314 to the foil 306 may involve wedge bonding, a low temperature snap cure die attach, a reverse bond stitch on ball, a post-die attach citric acid cleaning operation and/or any suitable operation(s) that are known to persons of ordinary skill in the art.

Figure 3G:
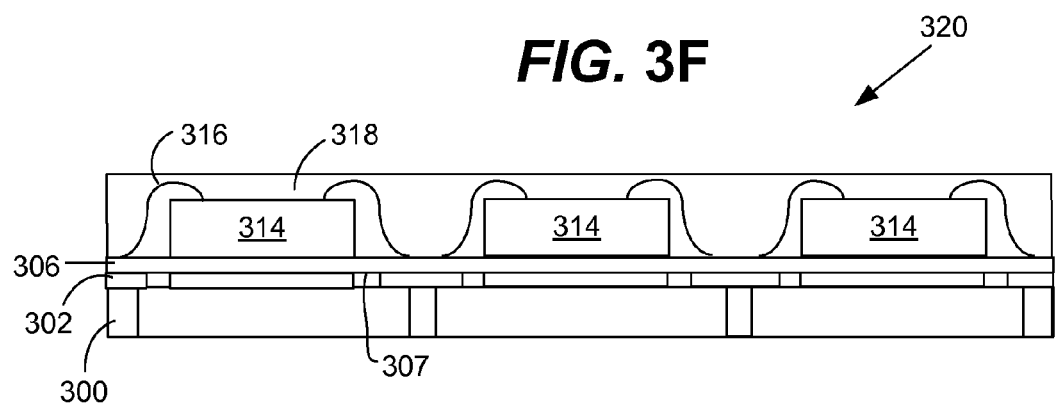

At step 208 of FIG. 2, the dice 314, bonding wires 316 and portions of the foil 306 are encapsulated in a molding material 318 to form a molded foil carrier structure 320. The molding material 318 of FIG. 3G is preferably applied as a continuous strip such that the molding material 318 is distributed relatively evenly over the molded portions of the molded foil carrier structure 320. The molding material 318 applied in step 208 typically provides enough structural support for the thin metallic foil 306 such that the carrier 300 is no longer necessary.

Figure 3H:
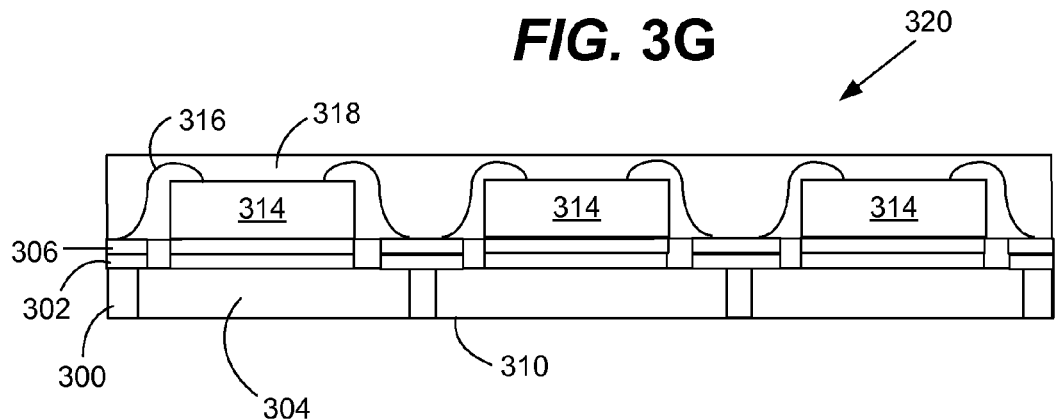
Figure 3I:
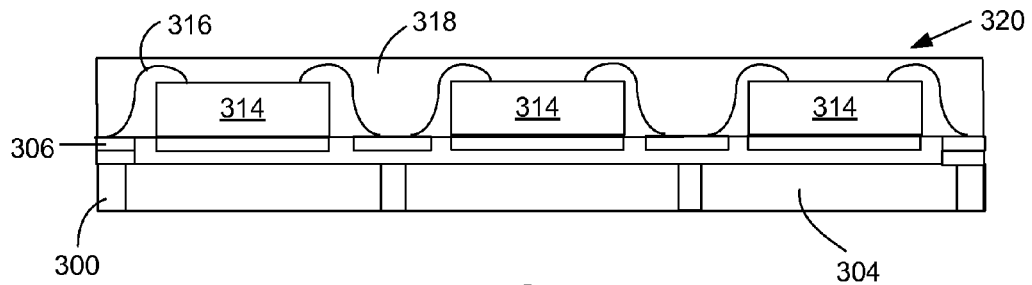
Figure 3J:
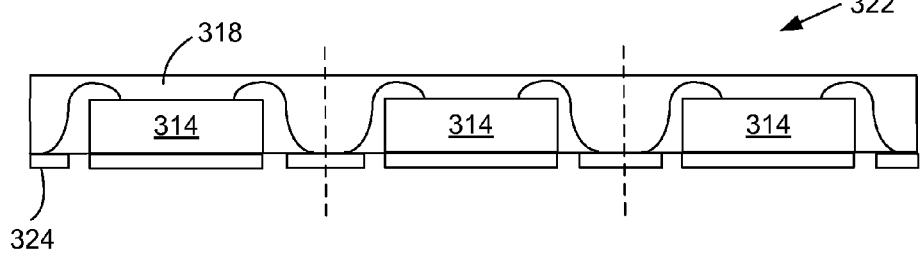

Afterward, portions 303 of the photoresist layer 302 are removed and the metallic foil 306 is etched using any conventional etching process (step 210 of FIG. 2 and FIGS. 3G and 3H). In the illustrated embodiment, for example, a developer solution is applied that removes portions 303 of the photoresist layer 302. This exposes portions 307 of the underlying foil 306. Example etch processes include plasma etching and wet etching, but any suitable etch process may be used that sufficiently removes the exposed portions of the metallic foil 306. In the illustrated embodiment, the etching process involves removing exposed portions 307 of the underlying foil 306 that are not covered with the photoresist layer 302. The etching of the foil 306 takes place through the openings 304 and from the bottom side 310 of the carrier 300. At step 212, the photoresist layer 306 is removed. In the illustrated embodiment of FIG. 3I, the removal of the intermediate photoresist layer 302 causes the carrier 300 to at least partially or entirely detach from the etched foil 306.

Figure 4A:
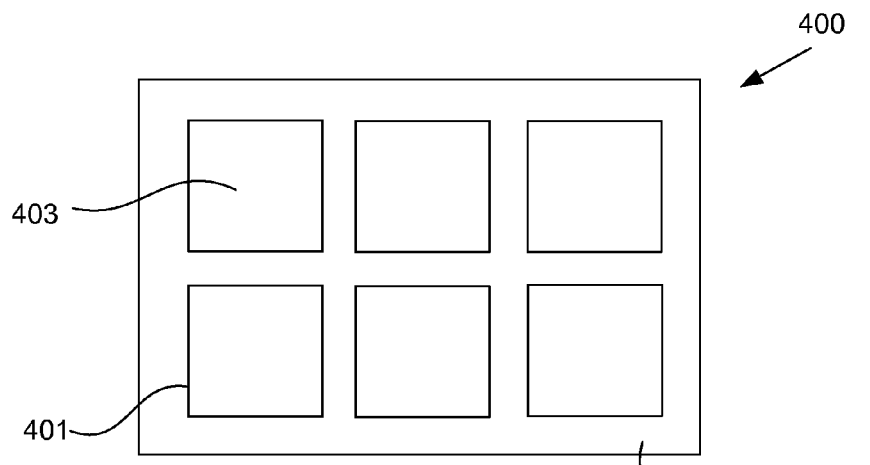
FIG. 4A is a diagrammatic bottom view of a molded foil carrier structure before the etching of the foil in accordance with one embodiment of the present invention.
Figure 4B:
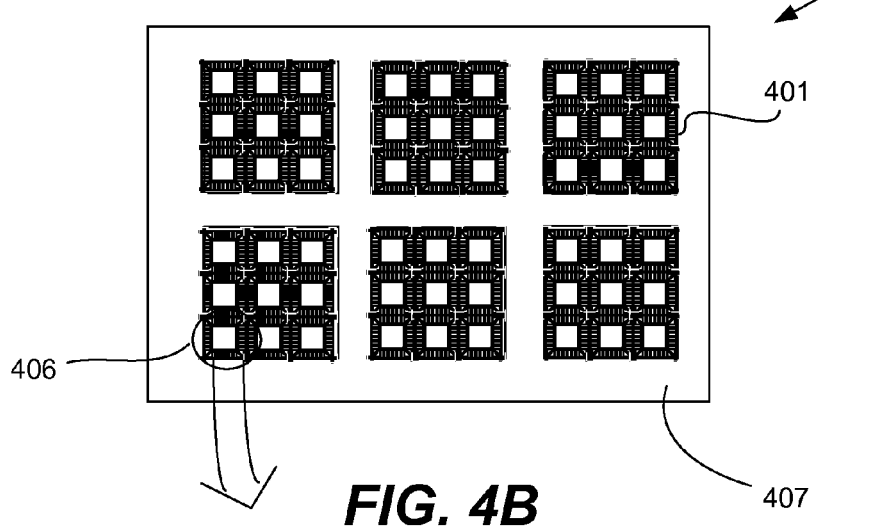
FIG. 4B is a diagrammatic bottom view of a molded foil carrier structure after the etching of the foil in accordance with one embodiment of the present invention.
Figure 4C:
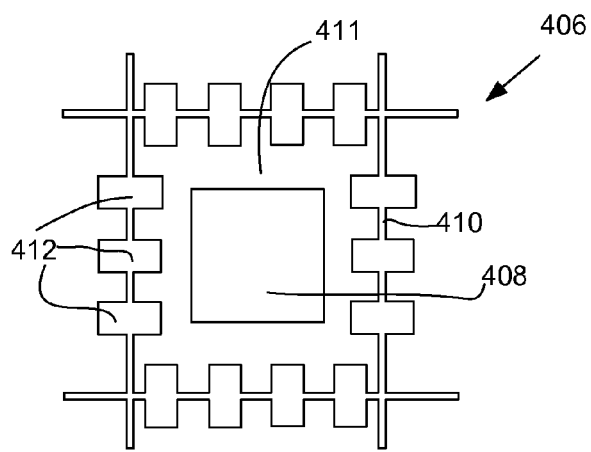
FIG. 4C is an enlarged diagrammatic top view of a device area illustrated in FIG. 4B.

Referring now to FIGS. 4A-4C, the etching of the foil in the foil carrier structure will be described from a different spatial perspective. FIG. 4A illustrates a bottom view of a molded foil carrier structure 400 according to a particular embodiment of the present invention. Openings 401 in the carrier 407 allow access to a patterned photoresist layer 403 and the underlying foil (not shown). FIG. 4B illustrates a bottom view of the molded foil carrier structure 400 after the etching of the underlying foil and the stripping of the photoresist layer. The etching has defined multiple device areas 406 in the foil. The device areas may have a wide variety of arrangements and configurations, depending on the needs of a particular application. In the illustrated embodiment, for example, the device areas 406 are arranged in multiple arrays, where each array of device areas 406 is in a region defined by an opening 401 in the carrier 407. For the purpose of illustration, each array includes only 9 device areas, for a total of 54 device areas. It should be appreciated that each array and opening can accommodate fewer or many more device areas. By way of example, approximately between 15 to 300 device areas per opening works well for various applications.

FIG. 4C is an enlarged view of one of the device areas 406 illustrated in FIG. 4B. The exact design of the device area 406 may vary widely between various implementations. In the illustrated embodiment, for example, the etching of the foil has formed exposed electrical contacts 412 and a die attach pad 408. The electrical contacts 412 and the die attach pad 408 are set in molding material 411. In some designs, optional tie bars 410 may be used to electrically couple the electrical contacts 412 and the die attach pad 408 such that a single electroplating step may be used to plate the entire molded foil structure.

Figure 3K:
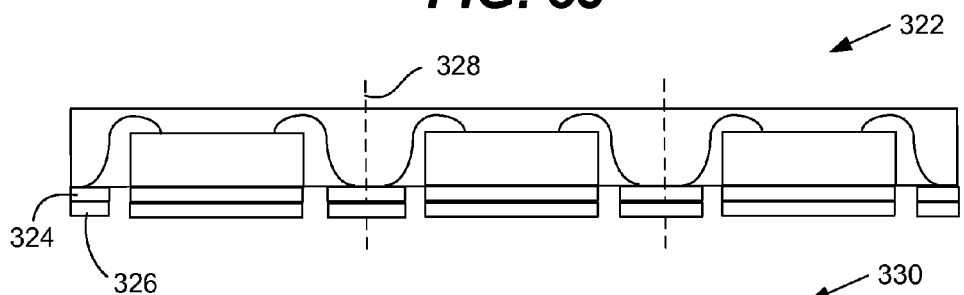

Referring back to FIGS. 3I and 3J, after the etching of the foil and the stripping of the photoresist, the carrier 304 is removed (step 214) to form a molded foil structure 322 of FIG. 3J. In the illustrated embodiment, the molded foil structure 322 includes multiple exposed electrical contacts 324. In FIG. 3K, an electroplating step is performed to plate the exposed electrical contacts with a solder layer 326. Finally, in step 216 of FIG. 2, the molded foil structure 322 is singulated along saw streets 328 to form multiple integrated circuit packages. Molded foil structure 322 may be singulated using a variety of techniques, including sawing and laser cutting. The singulation step 216 may be used to sacrifice the optional tie bars (e.g., tie bars 410 of FIG. 4C) so that the electrical contacts 324 are electrically isolated from each other.

Figure 3L:
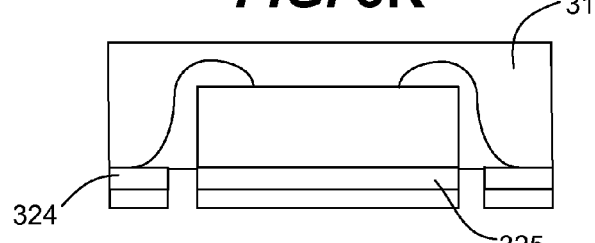
Figure 3M:
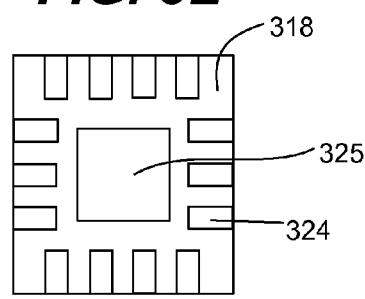

FIGS. 3L-3M illustrate diagrammatic side and bottom views, respectively, of a singulated integrated circuit package 330. The bottom view in FIG. 3M shows the molding material 318 surrounding exposed contacts 324 and die attach pad 325. In embodiments with electroplated solder layer 326, the exposed electrical contacts 324 and die attach pad 325 would be further plated with a layer of solder 326. The electroplated solder layer 326 may then be used to electrically connect the final integrated circuit package 330 to a suitable substrate, such as a printed circuit board.

Figure 5:
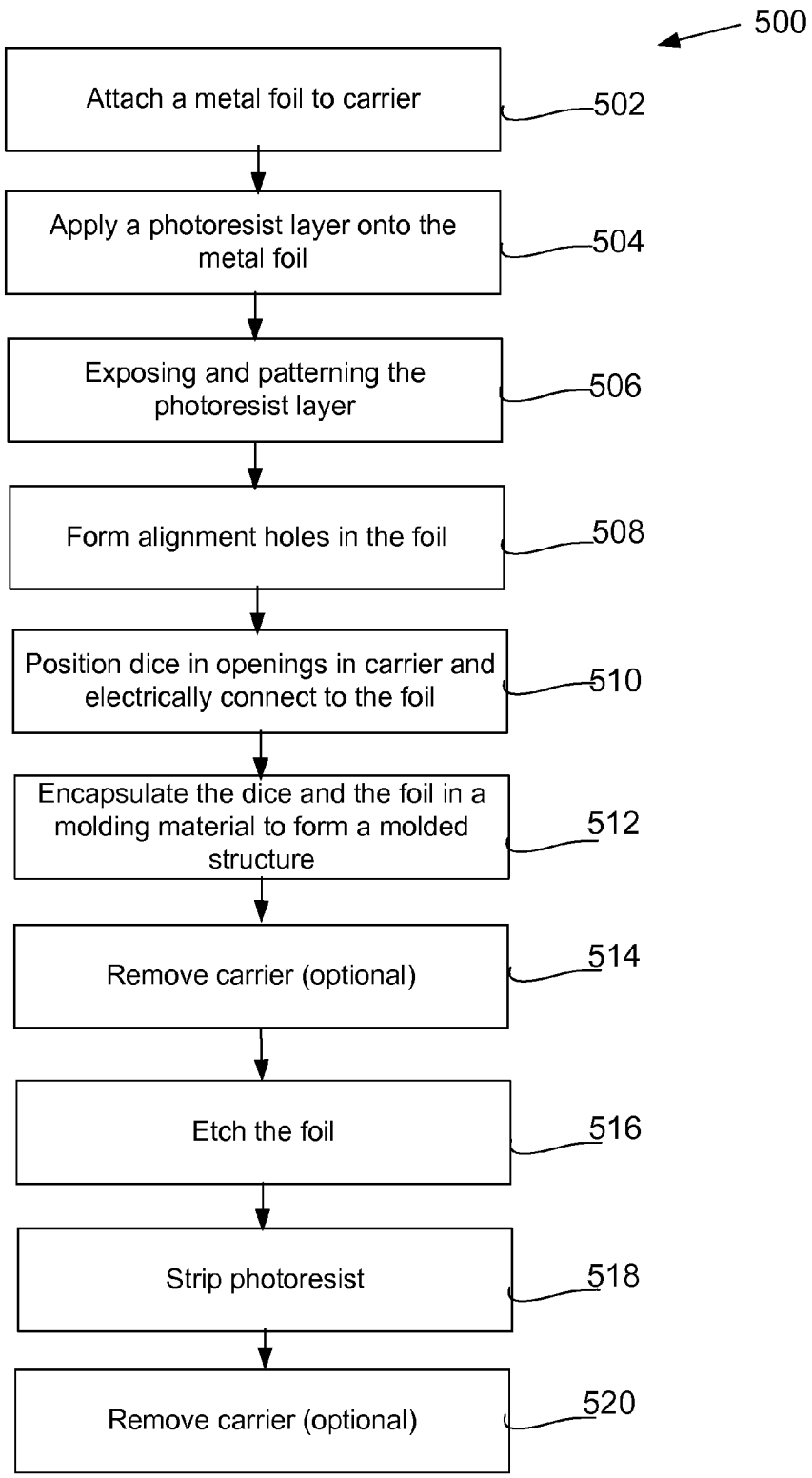
FIG. 5 is a flow chart illustrating foil based process for packaging integrated circuits in accordance with various embodiments of the present invention

Referring next to FIG. 5 in combination with FIGS. 6A-6L, another method 500 for packaging integrated circuits according to a particular embodiment of the present invention will be described. There are several similarities between the method 500 of FIG. 5 and the method 200 of FIG. 2 described above. Like the method 200, the method 500 involves attaching a metallic foil and a photoresist layer with a windowed carrier. Additionally, the method 500 also involves patterning the photoresist layer prior to connecting dice to the metallic foil. The method 500, however, departs from the previously proposed method 200 in several ways, as will be described in greater detail below.

Figure 6A:
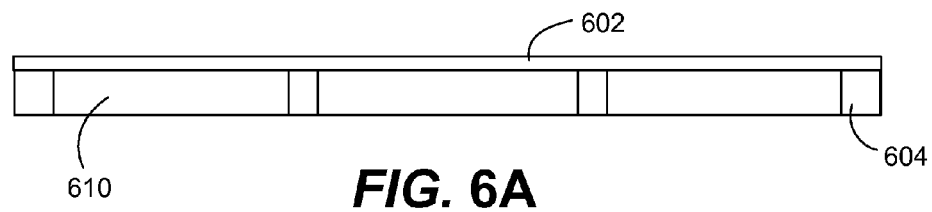
FIGS. 6A-6L are diagrammatic side and top views of various stages of the packaging process illustrated in FIG. 5.
Figure 6B:
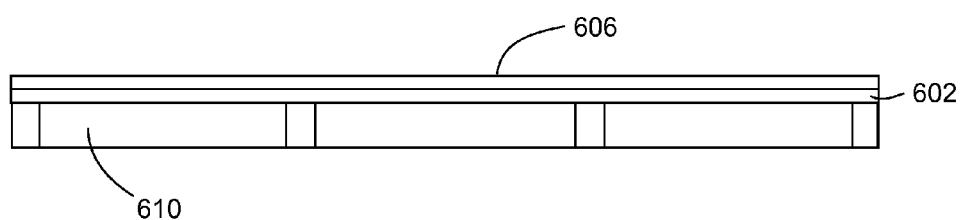

Initially, a metallic foil 602 of FIG. 6A is attached to a carrier 604 (step 502 of FIG. 5). The metallic foil 602 may be secured to the carrier 604 using any suitable technique, including the use of a glue or adhesive. The foil may also be ultrasonically bonded to the carrier 604 as described in U.S. patent application Ser. Nos. 12/133,335 or 12/633,703, both of which are incorporated herein by reference. A photoresist layer 606 of FIG. 6B is applied to the metallic foil 602 (step 504) such that the metallic foil 602 is sandwiched between the photoresist layer 606 and the carrier 604. The photoresist layer 504 may be secured to the bonded foil and carrier using any suitable technique, such as lamination.

Figure 6C:
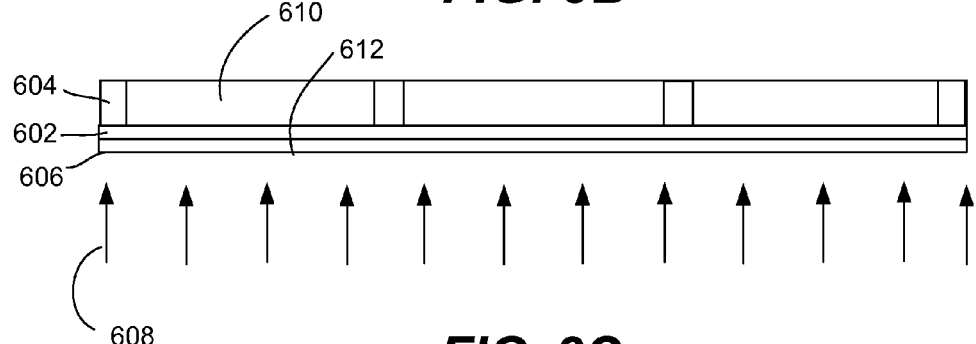
Figure 6D:
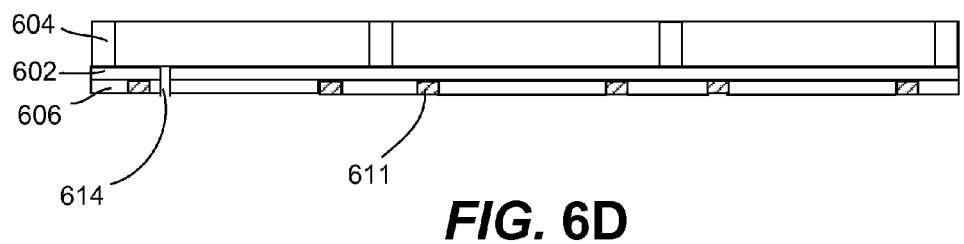

At step 506, the photoresist layer 606 is exposed and patterned. FIG. 6C illustrates the exposure of the photoresist layer 606 to a light 608. Unlike method 200 of FIG. 2, the light 608 is not arranged to pass through the openings 610 in the carrier 604. Instead, the light 608 is projected onto an exposed top surface 612 of the the photoresist layer 606, which covers the openings 610 in the carrier 604. Afterward, the photoresist layer 606 is patterned (step 506) using any known photolithographic techniques. In the illustrated embodiment, for example, the exposure of the positive photoresist layer 606 causes portions 611 of the photoresist layer 606 to be chemically altered so that they are soluble in a suitable developer solution. In other embodiments, a negative photoresist may be used. One or more alignment features (e.g., alignment holes 614 of FIG. 6D) are then formed in the underlying metallic foil 602 (step 508).

Figure 6E:
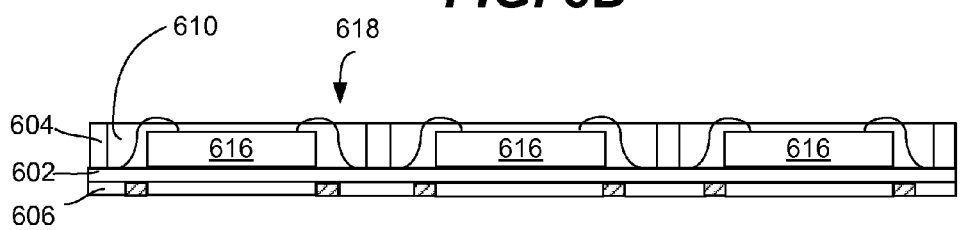

The alignment features formed in the foil 602 are used to help properly position and connect multiple integrated circuit dice 616 to the foil 602 (step 510 and FIG. 6E). In a preferred implementation, the dice 616 are wirebonded directly to the foil 602 without the use of an intermediate adhesion layer (e.g., without pre-plating the foil 602 with silver). In the illustrated embodiment, the openings 610 of the carrier 604 are each sealed off at one end by the metallic foil 602 to form multiple recesses 618. The dice 616 are positioned on the foil 602 within these recesses 618. In some implementations, the dice 616 are entirely encircled by and/or do not extend outside the periphery of the carrier 604.

Figure 6F:
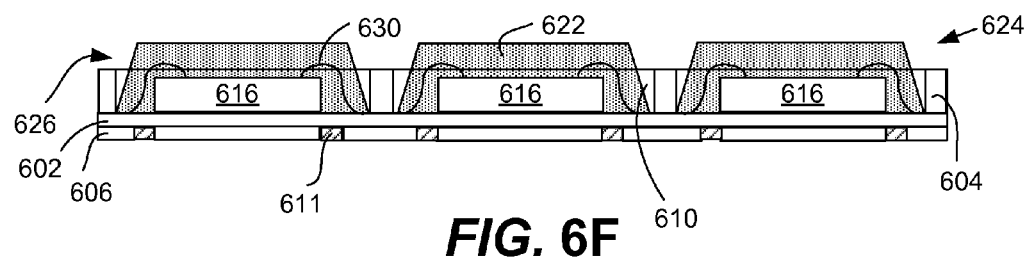
Figure 6G:
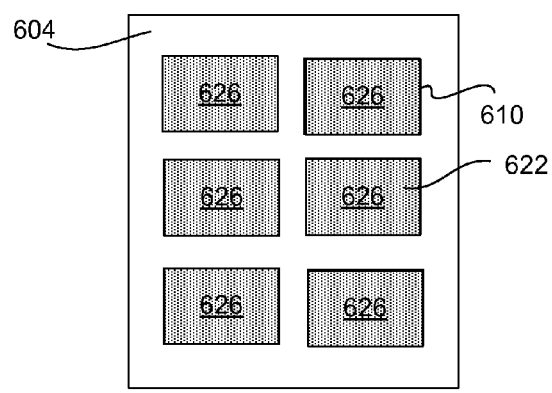

At step 512 of FIG. 5 in combination with FIG. 6F, the dice 616, the bonding wires 630 and portions of the foil 602 are encapsulated in a molding material 622 to form a molded foil carrier structure 624. The molding material 622 at least partially fills the openings 610 in the carrier 604. In the illustrated embodiment, the molding material 622 in any one opening 610 does not extend and come in contact with molding material 622 in any other opening 610. An example of this arrangement is shown in FIG. 6G, which is a diagrammatic top view of the molded foil carrier structure 624. In this implementation, the molding material 622 does not form a continuous surface that overlies multiple openings 610 on the carrier. Instead, each opening 610 is filled at least partially with molding material 622 to form a molded frame 626 that is physically separated from the other molded frames 626. (For the purpose of illustration, the side view of FIG. 6F illustrates an opening 610 and a molded frame 616 that is wide enough to accommodate a single device area and a single die. It should be noted, however, that the width of each molded frame 626 would typically be arranged to accommodate more device areas and dice.)

Once the dice 616, foil 602 and bonding wires 620 are encapsulated, the carrier may be optionally removed (step 514). Generally, the carrier 604 can simply be mechanically pulled free from the molded foil carrier structure 624, although other suitable techniques may also be used to remove the carrier. Preferably, such techniques help preserve the structural integrity of the carrier so it can be reused or recycled. There are possible advantages to removing the carrier 604 at this stage. By removing the carrier 604 before the etching of the foil, the carrier avoids being immersed in and corroded by etching chemicals. Therefore, the removed carrier 604 may be more suitable for reuse and/or recycling.

Figure 6H:
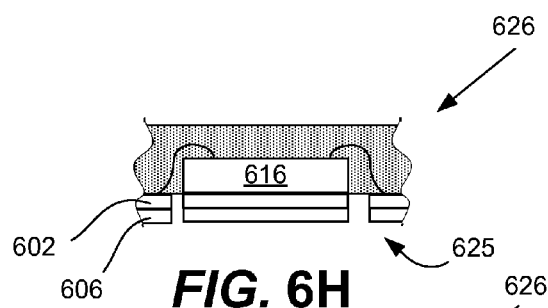
Figure 6I:
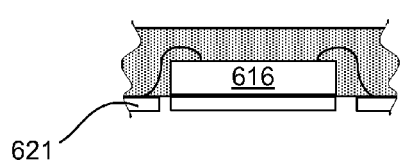

In the embodiment illustrated in FIGS. 6H and 6I, it is assumed that the carrier 604 was removed after encapsulation and before the etching of the foil. (A different sequence of operations that assumes the retention of the carrier 604 through the etching process is described later in connection with FIGS. 6J-6L.) Once the carrier 604 has been removed, multiple, separate molded frames 626 are formed. At step 516 and FIG. 6H, portions 611 of the photoresist layer on one of the molded frames 626 are removed and the underlying portions of the metallic foil 602 are etched. The etching process forms multiple device areas 625 from the foil 602. In various implementations, each device area 625 supports at least one integrated circuit die and has features substantially identical to those of the device area 406 of FIG. 4C. Each molded frame 626 may thus include multiple devices areas. By way of example, a density of approximately 15 to 300 device areas per molded frame 626 works well for various applications.

Afterward, at step 518 and FIG. 6I, the photoresist layer 606 is stripped. The exposed electrical contacts 621 of each molded frame may be optionally plated and the molded frame may be singulated to form individual IC packages in the manner of FIGS. 3K-3M. Each integrated circuit package may be substantially identical to the package 330 illustrated in FIGS. 3L and 3M.

Figure 6J:
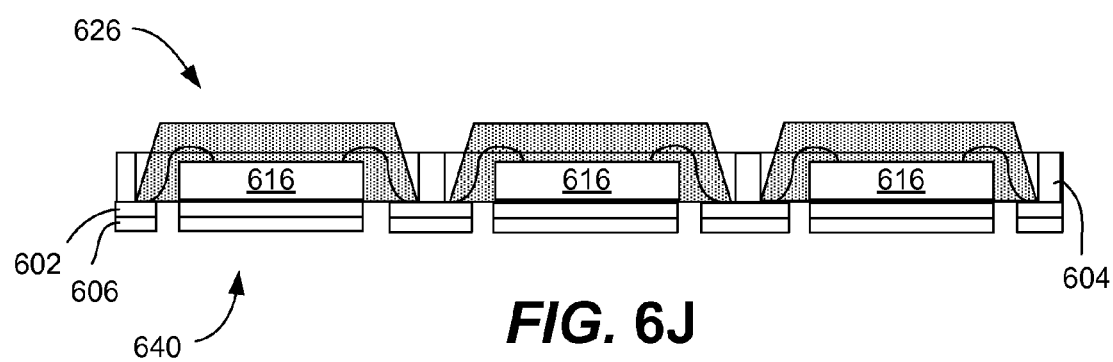

Referring now FIGS. 6J-6L, a foil etching process (step 516) will be described in which the carrier 604 has not been removed before etching but is instead retained through the etching process. One possible advantage of retaining the carrier 604 is that the carrier 604 can be used to hold together multiple molded frames 626, so that they can be etched and processed at the same time. In the illustrated embodiment of FIG. 6J, portions 611 of the photoresist layer are removed and the thin foil 602 on the carrier 604 is etched (step 516). This etching process forms multiple device areas from the foil on the molded frames 626 as discussed earlier in connection with FIG. 6H.

Figure 6K:
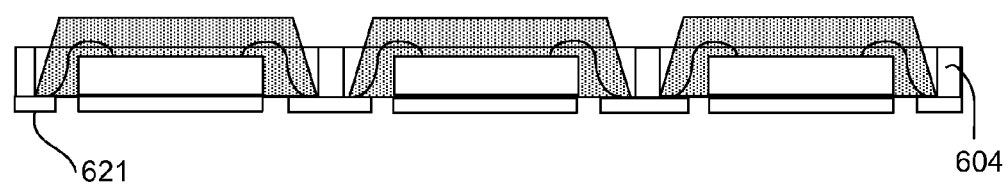
Figure 6L:
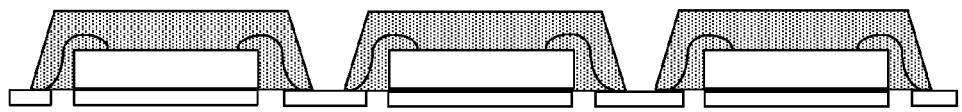

Afterward, the photoresist layer 606 is stripped (step 518 and FIG. 6K). Exposed electrical contacts 621 may be optionally plated with a solder layer (not shown). The above steps may be performed in a manner similar to that of steps 210 and 212 of FIG. 2 and FIG. 3K. In step 520 and FIG. 6L, the carrier 604 may then be removed by mechanically pulling or punching it off of the molded frames 626, although other suitable techniques for removing the carrier 604 may also be used. Once the carrier 604 is removed, multiple, separate molded frames 626 are formed. Each molded frame 626 can then be singulated into multiple integrated circuit packages in the manner of step 216 of FIG. 2. Each integrated circuit package may be substantially identical to the package 330 illustrated in FIGS. 3L and 3M.

Although only a few embodiments of the invention have been described in detail, it should be appreciated that the invention may be implemented in many other forms without departing from the spirit or scope of the invention. For example, in order to reduce redundancy, the steps illustrated in FIG. 5 were sometimes not described to the same degree of detail as they were in FIG. 2. It should be assumed that the steps of FIG. 5 may incorporate any features mentioned with respect to corresponding steps of FIG. 1 or 2, and vice versa. For example, some details relating to the patterning of the photoresist layer and the subsequent etching of the foil are not specifically mentioned in connection with the method of FIG. 5 (e.g., selective exposure of portions of the photoresist layer may cause cross-linking of some portions and not others, thus causing some but not all portions of the photoresist layer to be soluble in a developer solution; after the encapsulation and die attach operations, portions of the photoresist layer are removed to form gaps in the photoresist layer; these gaps expose portions of the underlying foil surface, the etching removes the exposed portions of the foil to define multiple device areas in the foil, etc.) However, these details are described elsewhere in the present application. Hence, it should be appreciated that such features may optionally apply to the patterning and etching processes of both FIGS. 2 and 5. Additionally, it should be appreciated that almost any of the operations illustrated in FIGS. 2 and 5 may be replaced, modified, deleted and/or reordered to meet the needs of particular applications. It should be noted that the embodiments described herein may be suitably modified for particular applications and are not limited to the exact designs shown in the drawings. By way of example, the integrated circuit package 330 of FIG. 3L is shown with an exposed die attach pad 325. However, the present invention also contemplates variations on this design, such as an integrated circuit package that does not have an exposed die attach pad 325. In another example, there is some discussion in the present application indicating that the dice may be wirebonded directly to the foil without an intermediate adhesion layer (e.g., without pre-plating the foil with silver.) However, the present application also contemplates various embodiments where there is an intermediate adhesion layer that helps electrically and physically connect the dice to the foil. Therefore, the present embodiments should be considered as illustrative and not restrictive and the invention is not limited to the details given herein, but may be modified within the scope and equivalents of the appended claims.

What is claimed is:

1. A method for packaging integrated circuits, comprising:
laminating a metallic foil, a metal carrier and a photoresist layer sandwiched therebetween, the photoresist layer acting as an intermediate adhesion layer that bonds the carrier to the metallic foil, wherein the metal carrier has a plurality of openings to provide access to the underlying photoresist layer;
exposing and patterning the photoresist layer, wherein developing of the photoresist layer is performed after a die attach, a wire bond and an encapsulation operation;
drilling a plurality of alignment features through the metallic foil and the photoresist layer;
attaching a plurality of integrated circuit die to the metallic foil using the alignment features for alignment;
wirebonding the plurality of integrated circuit die directly to the metallic foil with no intermediate adhesion layer;
encapsulating the integrated circuit die, bonding wires and portions of the foil in a molding material;
removing portions of the exposed photoresist layer using a developer solution to expose portions of the underlying metallic foil;
etching the exposed portions of the metallic foil through the plurality of openings in the metal carrier to define a plurality of device areas in the metallic foil;
removing the photoresist layer, wherein removal of the photoresist layer causes the metal carrier to detach from the etched metallic foil to form a molded foil structure;
electroplating the exposed portions of the metallic foil to plate the exposed portions of the metallic foil with a solder layer; and
singulating the molded foil structure using either sawing or laser cutting.

2. A method as recited in claim 1, wherein:
the metal carrier is made of one of a group consisting of mild steel, carbon steel, stainless steel, aluminum, copper; and the metallic foil is made of copper.

3. A method as recited in claim 1, wherein:
the metallic foil is between 5 and 80 microns in thickness.

4. A method as recited in claim 1, wherein:
the wirebonding wires are comprised of one of a group consisting of gold and aluminum.

5. A method as recited in claim 1, wherein:
a post-die attach citric acid cleaning operation is provided after attaching the plurality of integrated circuits to the metallic foil using the alignment features is accomplished.

6. A method for packaging integrated circuits, comprising:
attaching a metallic foil to a metal carrier using a suitable technique including glue, adhesive or ultrasonic bonding, wherein the metal carrier has a plurality of openings to provide access to the underlying metallic foil, the metallic foil and the plurality of openings in the metal carrier forming multiple recesses;
applying a photoresist layer to the metallic foil such that the metal foil is sandwiched between the photo resist layer and the metal carrier;

exposing and patterning the photoresist layer, wherein developing of the photoresist layer is performed after a die attach, a wire bond and an encapsulation operation;

forming a plurality of alignment features through the metallic foil and the photoresist layer;

attaching a plurality of integrated circuit die to the metallic foil using the alignment features for alignment, wherein the integrated circuit die are positioned on the metallic foil within the multiple recesses;

wirebonding the plurality of integrated circuit die directly to the metallic foil with no intermediate adhesion layer;

encapsulating the integrated circuits die, bonding wires and portions of the foil in a molding material, wherein the molding material at least partially fills the multiple recesses;

detaching the metal carrier from the metallic foil to form a plurality of molded frame structures;

removing portions of the exposed photoresist layer using a developer solution to expose portions of the underlying foil;

etching exposed portions of the metallic foil to define a plurality of device areas in the metallic foil;

removing the photoresist layer, exposing electrical contacts on each molded frame structure;

Electroplating the exposed portions of the metallic foil of to plate the exposed portions of the metallic foil with a solder layer; and Singulating the molded frame structure using either sawing or laser cutting.

7. A method as recited in claim 6, wherein:
the metal carrier is made of one of a group consisting of mild steel, carbon steel, stainless steel, aluminum, copper; and the metallic foil is made of copper.

8. A method as recited in claim 6, wherein:
the metallic foil is between 5 and 80 microns in thickness.

9. A method as recited in claim 6, wherein:
the wire bonding wires are comprised of one of a group consisting of gold and aluminum.

10. A method as recited in claim 6, wherein:
a post-die attach citric acid cleaning operation is provided after attaching the plurality of integrated circuits to the metallic foil using the alignment features is accomplished.

* * * * *